(12) United States Patent
Cosceev et al.

(10) Patent No.: US 10,770,309 B2
(45) Date of Patent: Sep. 8, 2020

(54) FEATURES FOR IMPROVING PROCESS UNIFORMITY IN A MILLISECOND ANNEAL SYSTEM

(71) Applicants: Mattson Technology, Inc., Fremont, CA (US); Beijing E-Town Semiconductor Technology Co., Ltd., Beijing (CN)

(72) Inventors: Alexandr Cosceev, Lonsee (DE); Markus Hagedorn, Ulm (DE); Christian Pfahler, Ulm (DE)

(73) Assignees: MATTSON TECHNOLOGY, INC., Fremont, CA (US); BEIJING E-TOWN SEMICONDUCTOR TECHNOLOGY CO., LTD., Beijing (CN)

( * ) Notice: Subject to any disclaimer, the term of this patent is extended or adjusted under 35 U.S.C. 154(b) by 775 days.

(21) Appl. No.: 15/378,580

(22) Filed: Dec. 14, 2016

(65) Prior Publication Data

US 2017/0194163 A1    Jul. 6, 2017

Related U.S. Application Data

(60) Provisional application No. 62/272,817, filed on Dec. 30, 2015.

(51) Int. Cl.
*H01L 21/324* (2006.01)
*F27B 5/04* (2006.01)
(Continued)

(52) U.S. Cl.
CPC ........ *H01L 21/324* (2013.01); *H01L 21/2686* (2013.01); *H01L 21/6719* (2013.01);
(Continued)

(58) Field of Classification Search
None
See application file for complete search history.

(56) References Cited

U.S. PATENT DOCUMENTS 6,114,216 A * 9/2000 Yieh ............... C23C 16/0245
438/424
6,204,203 B1  3/2001 Narwankar et al.
(Continued)

FOREIGN PATENT DOCUMENTS

| JP | 2009123810 | 6/2009 |
|---|---|---|
| JP | 2014175638 | 9/2014 |
| WO | WO 2002/05323 | 1/2002 |

OTHER PUBLICATIONS

PCT International Search Report for corresponding PCT Application No. PCT/US2016/066561, dated Mar. 29, 2017, 3 pages.
(Continued)

*Primary Examiner* — Joseph M Pelham
(74) *Attorney, Agent, or Firm* — Dority & Manning, P.A.

(57) ABSTRACT

Systems and methods for improving process uniformity in a millisecond anneal system are provided. In some implementations, a process for thermally treating a substrate in a millisecond anneal system can include obtaining data indicative of a temperature profile associated with one or more substrates during processing in a millisecond anneal system. The process can include one or more of (1) changing the pressure inside the processing chamber of the millisecond anneal system; (2) manipulating the irradiation distribution by way of the refracting effect of a water window in the millisecond anneal system; (3) adjusting the angular positioning of the substrate; and/or (4) configuring the shape of the reflectors used in the millisecond anneal system.

10 Claims, 17 Drawing Sheets

(51) Int. Cl.

| | | |
|---|---|---|
| *F27B 5/16* | (2006.01) | |
| *F27B 5/18* | (2006.01) | |
| *H01L 21/67* | (2006.01) | |
| *H01L 21/687* | (2006.01) | |
| *H01L 21/268* | (2006.01) | |
| *H05B 3/00* | (2006.01) | |
| *F27B 17/00* | (2006.01) | |

(52) U.S. Cl.
CPC .. *H01L 21/67109* (2013.01); *H01L 21/67115* (2013.01); *H01L 21/68785* (2013.01); *H05B 3/0047* (2013.01); *F27B 5/04* (2013.01); *F27B 5/16* (2013.01); *F27B 17/0025* (2013.01)

(56) References Cited

U.S. PATENT DOCUMENTS

| | | | |
|---|---|---|---|
| 7,442,415 B2 | 10/2008 | Conley, Jr. et al. | |
| 7,790,633 B1 | 9/2010 | Tarafdar et al. | |
| 8,323,754 B2 | 12/2012 | Olsen et al. | |
| 8,809,175 B2 | 8/2014 | Tsai et al. | |
| 9,093,468 B2 | 7/2015 | Tsai et al. | |
| 2004/0058560 A1* | 3/2004 | Ranish | F27B 17/0025 438/795 |
| 2005/0172904 A1 | 8/2005 | Koshimizu et al. | |
| 2009/0114158 A1* | 5/2009 | Zucker | C23C 14/50 118/729 |
| 2009/0175605 A1 | 7/2009 | Kobayashi | |
| 2009/0175606 A1 | 7/2009 | Bezama et al. | |
| 2011/0034015 A1 | 2/2011 | Yoshino et al. | |
| 2011/0081137 A1 | 4/2011 | Masuda | |
| 2011/0312156 A1* | 12/2011 | Cattet | H01L 21/187 438/458 |
| 2012/0088194 A1* | 4/2012 | Tsubaki | G03F 7/0392 430/319 |
| 2014/0169772 A1 | 6/2014 | Abe et al. | |
| 2014/0199056 A1* | 7/2014 | Chang | H01L 21/67115 392/416 |
| 2015/0140838 A1 | 5/2015 | Kashefi et al. | |
| 2017/0194177 A1* | 7/2017 | Cibere | H01L 21/324 |

OTHER PUBLICATIONS

Ragnarsson et al., "The Importance of Moisture Control for EOT Scaling of Hf-Based Dielectrics," *Journal of the Electrochemical Society*, vol. 156, Issue 6, Apr. 3, 2009, pp. H416-H423.

Ferrari et al., "Diffusion Reaction of Oxygen in HfO2/SiO2/Si Stacks," *The Journal of Physical Chemistry B*, vol. 110, No. 30, Jul. 12, 2006, pp. 14905-14910.

Driemeier et al., "Thermochemical behavior of hydrogen in hafnium silicate films on Si," Applied Physics Letters, vol. 89, Issue 5, Aug. 2006,—4 pages.

Driemeier et al., "Room temperature interactions of water vapor with Hf O2 films on Si," Applied Physics Letters, vol. 88, Issue 20, May 2006—3 pages.

Conley, Jr. et al., "Densification and improved electrical properties of pulse-deposited films via in situ modulated temperature annealing," *Applied Physics Letters*, vol. 84, Issue 11, Mar. 15, 2004, pp. 1913-1915.

Nakajima et al., "Experimental Demonstration of Higher-k phase HfO2 through Non-equilibrium Thermal Treatment," ECS Transactions 28.2 (2010), pp. 203-212.

Wu et al., "Device Performance and Reliability Improvement for MOSFETs With HfO2 Gate Dielectrics Fabricated Using Multideposition Room-Temperature Multiannealing," IEEE Electron Device Letters, vol. 32, Issue 9, Sep. 2011, pp. 1173-1175.

PCT International Preliminary Report on Patentability for corresponding PCT Application No. PCT/US2016/066561, dated Jul. 12, 2018—9 pages.

\* cited by examiner

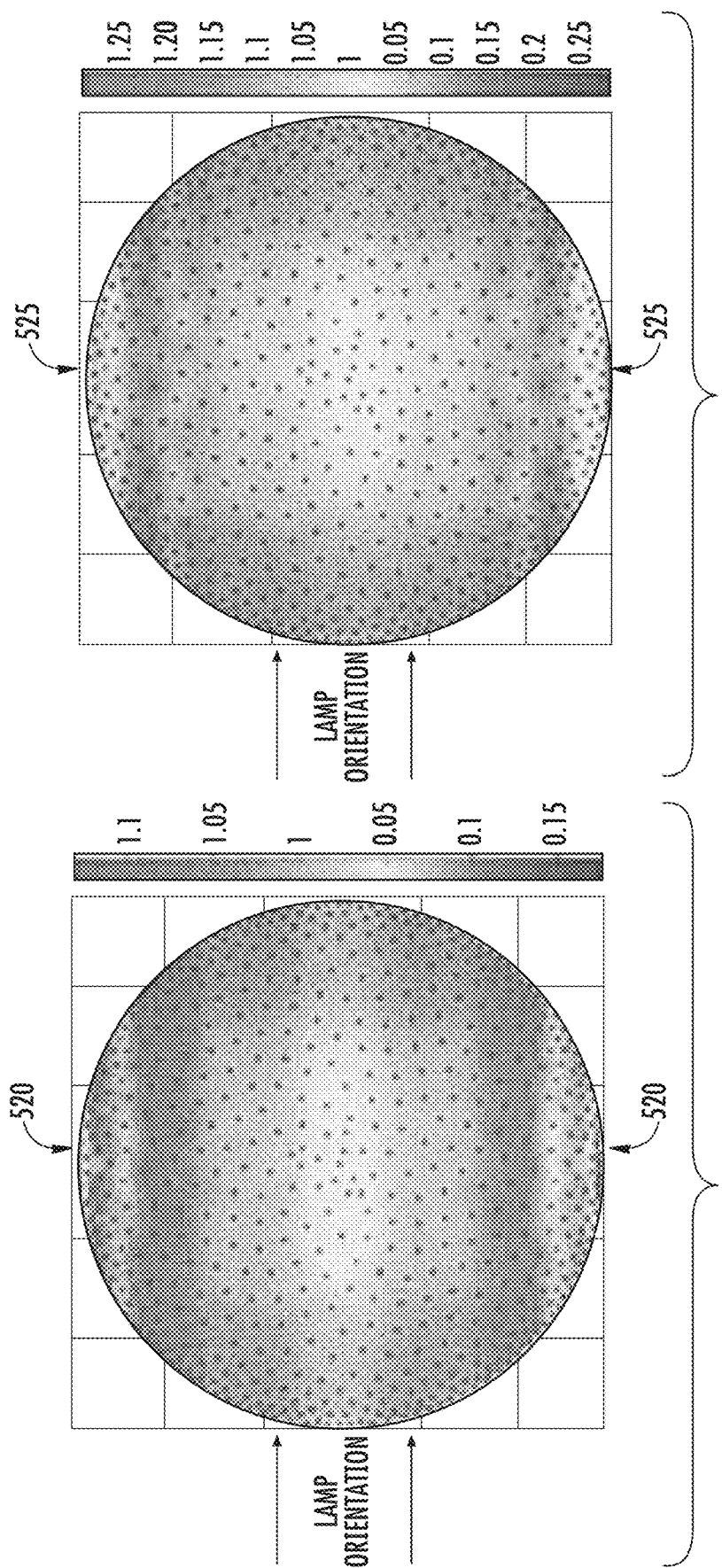

LINEAR PROFILE

FEATURES FOR IMPROVING PROCESS UNIFORMITY IN A MILLISECOND ANNEAL SYSTEM

PRIORITY CLAIM

The present application claims the benefit of priority of U.S. Provisional Patent Application Ser. No.: 62/272,817, filed Dec. 30, 2015, entitled "Features for Improving Process Uniformity in a Millisecond Anneal System," which is incorporated herein by reference.

FIELD

The present disclosure relates generally to thermal processing chambers and more particularly to millisecond anneal thermal processing chambers used for processing, for instance, semiconductor substrates.

BACKGROUND

Millisecond anneal systems can be used for semiconductor processing for the ultra-fast heat treatment of substrates, such as silicon wafers. In semiconductor processing, fast heat treatment can be used as an anneal step to repair implant damage, improve the quality of deposited layers, improve the quality of layer interfaces, to activate dopants, and to achieve other purposes, while at the same time controlling the diffusion of dopant species.

Millisecond, or ultra-fast, temperature treatment of semiconductor substrates can be achieved using an intense and brief exposure of light to heat the entire top surface of the substrate at rates that can exceed $10^4$ ° C. per second. The rapid heating of just one surface of the substrate can produce a large temperature gradient through the thickness of the substrate, while the bulk of the substrate maintains the temperature before the light exposure. The bulk of the substrate therefore acts as a heat sink resulting in fast cooling rates of the top surface.

SUMMARY

Aspects and advantages of embodiments of the present disclosure will be set forth in part in the following description, or may be learned from the description, or may be learned through practice of the embodiments.

One example aspect of the present disclosure is directed to a process for thermally treating a substrate in a millisecond anneal system. The process can include obtaining data indicative of a temperature profile associated with one or more substrates during processing in a millisecond anneal system. The millisecond anneal system can have a wafer plane plate dividing the processing chamber into a top chamber and a bottom chamber. The process can include adjusting a pressure in the processing chamber to affect a temperature uniformity across one or more substrates.

Another example aspect of the present disclosure is directed to a process for thermally treating a substrate in a millisecond anneal system. The process can include obtaining data indicative of a temperature profile associated with one or more substrates during processing in a millisecond anneal system. The millisecond anneal system can have a wafer plane plate dividing the processing chamber into a top chamber and a bottom chamber. The process can include determining a shape and configuration of one or more of an edge reflector or a wedge reflector in the millisecond anneal system based at least in part on the temperature profile.

Yet another example aspect of the present disclosure is directed to a process for thermally treating a substrate in a millisecond anneal system. The process can include obtaining data indicative of a temperature profile associated with one or more substrates during processing in a millisecond anneal system. The millisecond anneal system can have a wafer plane plate dividing the processing chamber into a top chamber and a bottom chamber. The wafer plane plate can include a non-rotating substrate support. The process can include determining an angular location for placement of a device substrate in a processing chamber of the millisecond anneal system. The angular position can be determined based at least in part on the data indicative of the temperature profile.

Variations and modification can be made to the example aspects of the present disclosure. Other example aspects of the present disclosure are directed to systems, methods, devices, and processes for thermally treating a semiconductor substrate.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which:

FIGS. 23(a) and 23(b) depicts the example improvement of irradiation distribution by adjusting the wedge angle of the top wedge according to example embodiments of the present disclosure;

DETAILED DESCRIPTION

Figure 1:
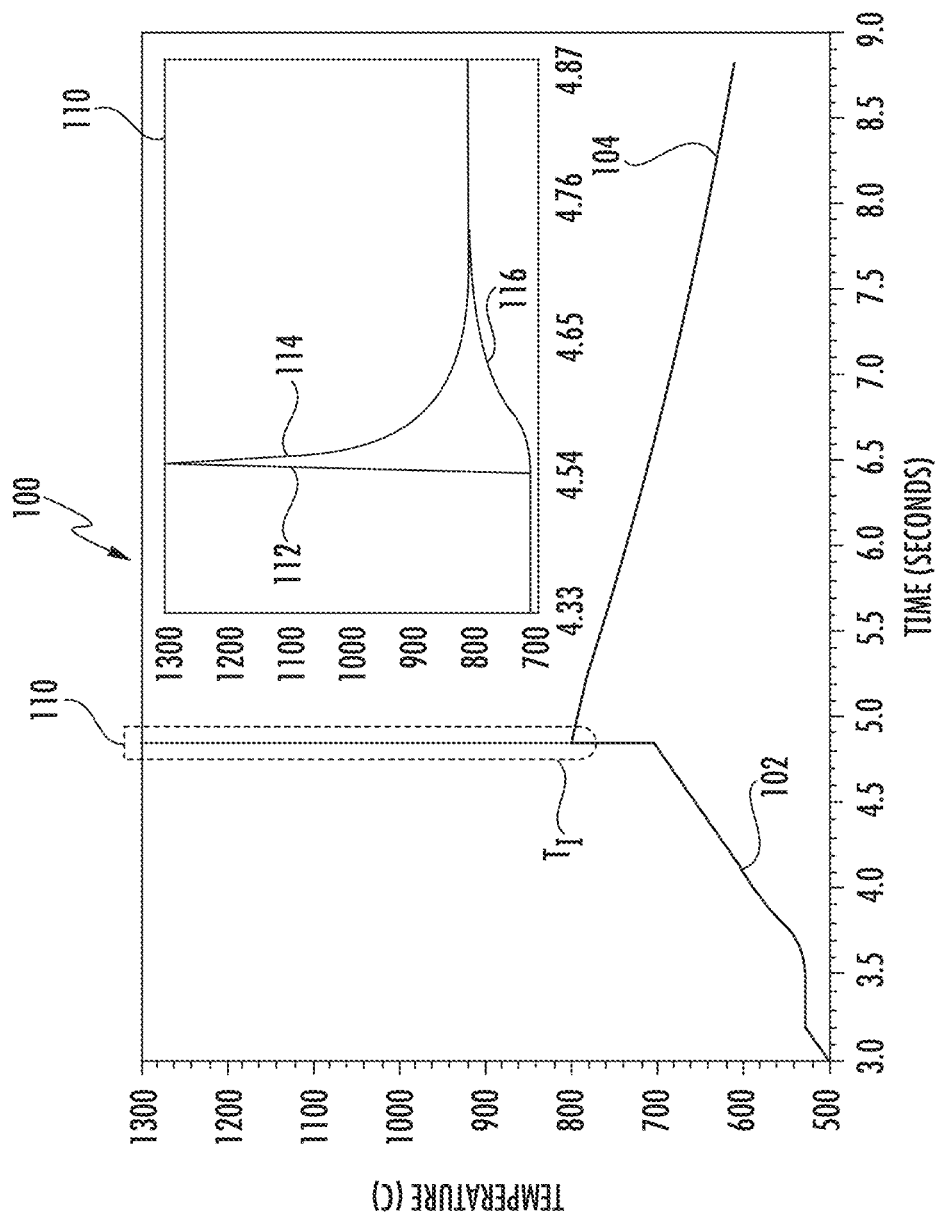
FIG. 1 depicts an example millisecond anneal heating profile according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Overview

Example aspects of the present disclosure are directed to features for improving temperature uniformity across a substrate (e.g., a semiconductor wafer) during processing in a millisecond anneal system. Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any workpiece, semiconductor substrate or other suitable substrate. The use of the term "about" in conjunction with a numerical value is intended to refer to within 10% of the stated numerical value.

Millisecond, or ultra-fast, temperature treatment of semiconductor substrates can be achieved using an intense and brief exposure of light to heat the entire top surface of the semiconductor substrate at rates that can exceed about $10^4$ ° C./sec. The flash of light is typically applied to a semiconductor substrate, which was previously heated to an intermediate temperature $T_i$ at ramp rates of up to 150° C./sec. After the heating process step, the semiconductor substrate is left inside the chamber for cool down. Both the low heating processes and the cool down can cause lateral temperature differences resulting in a non-uniform temperature distribution across the substrate. In many cases, the heat treatment applications can be temperature sensitive. In addition, wafer stress can be driven by thermal gradients in the wafer material. Large lateral thermal gradients can therefore result in wafer warping, slip, and even wafer breakage.

The main cause for temperature differences during the heat treatment lies in the non-uniform irradiation of the wafer surface by the light source. The main cause for temperature differences during the cool down phase can result from the geometry of the wafer itself. For instance, a wafer can be disk-shaped and for geometric reasons, the edges of the wafer can cool off faster than the center of the wafer. Another cause for temperature differences can result from the convective cooling effects by the gas ambient.

The non-uniformity can be mitigated by the use of highly reflective mirrors. For instance, the irradiation non-uniformity can be mitigated by the integrating effect of a cube with mirror walls. The cool down non-uniformity can be mitigated by redirecting light emitted from the wafer center to be re-absorbed by the wafer edge. Again, this can be achieved by way of the integrating effect of a cube with mirror walls.

Even though processing chambers in millisecond anneal systems can make use of the integrating effect of mirror walls, there can still be a residual non-uniformity, which needs to be further compensated. A prime influencing factor for compensating the residual non-uniformity can be by manipulating the irradiation distribution.

According to example embodiments of the present disclosure, various features are disclosed for improving the temperature uniformity of the semiconductor substrate during processing in a millisecond anneal system. These features can include, for instance: (1) changing the pressure inside the processing chamber of the millisecond anneal system; (2) manipulating the irradiation distribution by way of the refracting effect of a water window in the millisecond anneal system; (3) angular positioning of the wafer; and/or (4) configuring the shape and/or position of the reflectors used in the millisecond anneal system.

One example embodiment of the present disclosure is directed to a process for thermally treating a substrate in a millisecond anneal system. The process includes obtaining data indicative of a temperature profile associated with one or more substrates during processing in a millisecond anneal system. The millisecond anneal system includes a wafer plane plate dividing the processing chamber into a top chamber and a bottom chamber. The process includes adjusting a pressure in the processing chamber to affect a temperature uniformity across one or more substrates based at least in part on the data indicative of the temperature profile. For instance, in some embodiments, adjusting a pressure includes adjusting the pressure in the processing chamber during processing of at least one of the one or more substrates to adjust a temperature profile of the at least one of the one or more substrates. The pressure can be adjusted, for instance, within the range of +2 kPA to −2 kPA relative to atmospheric pressure.

In some embodiments, adjusting the pressure in the processing chamber includes adjusting a pressure differential between the processing chamber and a downstream line in a gas flow system configured to glow process gas through the processing chamber. The downstream line can be located downstream of one or more vent openings in the process chamber. Adjusting the pressure differential can include adjusting a valve disposed in the downstream line. The valve can be adjusted by one or more controllers based on one or more signals from a pressure sensor configured to measure pressure inside the processing chamber. The pressure can be adjusted to influence a flow pattern of process gas in the processing chamber.

In some embodiments, adjusting a pressure in the process chamber includes warping a water window based on the pressure in the processing chamber. The water window can include an inner plate and an outer plate with water flowing between the inner plate and the outer plate. The inner plate is disposed closer to the processing chamber relative to the outer plate. In some implementations, the water window can be warped such that the inner plate of the water window bends away from the processing chamber to provide a defocusing effect on the lamp light. In some implementations, the water window can be warped such that the inner plate of the water window bends toward the processing chamber to provide a focusing effect on the lamp light.

Another example embodiment of the present disclosure is directed to a process for thermally treating a substrate in a millisecond anneal system. The process includes obtaining data indicative of a temperature profile associated with one or more substrates during processing in a millisecond anneal system. The millisecond anneal system can include a wafer plane plate dividing the processing chamber into a top chamber and a bottom chamber. The process can include adjusting a shape, configuration, or position of one or more of an edge reflector or a wedge reflector in the millisecond anneal system based at least in part on the temperature profile.

In some embodiments, the wedge reflector can be located on a chamber wall proximate the wafer plane plate. Adjusting a shape, configuration, or position of one or more of an edge reflector or a wedge reflector in the millisecond anneal system includes adjusting a wedge angle and/or a height for the wedge reflector.

In some embodiments, the edge reflector is located in the wafer plane plate. Adjusting a shape, configuration, or position of one or more of an edge reflector or a wedge reflector in the millisecond anneal system includes adjusting a surface profile for the edge reflector. In some embodiments, adjusting a shape, configuration, or position of one or more of an edge reflector or a wedge reflector in the millisecond anneal system comprises adjusting, with one or more controllers, a position of wedge reflector relative to the substrate during processing of the substrate.

Another example embodiment of the present disclosure is directed to a process for thermally treating a substrate in a millisecond anneal system. The process includes obtaining data indicative of a temperature profile associated with one or more substrates during processing in a millisecond anneal system. The millisecond anneal system can include a wafer plane plate dividing the processing chamber into a top chamber and a bottom chamber. The process can include determining an angular location for placement of a device substrate in a processing chamber of the millisecond anneal system. The angular position can be determined based at least in part on the temperature profile. In some embodiments, the angular position can be determined based at least in part on a location of one or more support pins in the millisecond anneal system.

Example Millisecond Anneal Systems

An example millisecond anneal system can be configured to provide an intense and brief exposure of light to heat the top surface of a wafer at rates that can exceed, for instance, about $10^{4°}$ C./s. FIG. 1 depicts an example temperature profile 100 of a semiconductor substrate achieved using a millisecond anneal system. As shown in FIG. 1, the bulk of the semiconductor substrate (e.g., a silicon wafer) is heated to an intermediate temperature $T_i$ during a ramp phase 102. The intermediate temperature can be in the range of about 450° C. to about 900° C. When the intermediate temperature $T_i$ is reached, the top side of the semiconductor substrate can be exposed to a very short, intense flash of light resulting in heating rates of up to about $10^{4°}$ C./s. Window 110 illustrates the temperature profile of the semiconductor substrate during the short, intense flash of light. Curve 112 represents the rapid heating of the top surface of the semiconductor substrate during the flash exposure. Curve 116 depicts the temperature of the remainder or bulk of the semiconductor substrate during the flash exposure. Curve 114 represents the rapid cool down by conductive of cooling of the top surface of the semiconductor substrate by the bulk of the semiconductor substrate acting as a heat sink. The bulk of the semiconductor substrate acts as a heat sink generating high top side cooling rates for the substrate. Curve 104 represents the slow cool down of the bulk of the semiconductor substrate by thermal radiation and convection, with a process gas as a cooling agent. As used herein, the term "about" when used in reference to a numerical value refers to within 30% of the stated numerical value.

An example millisecond anneal system can include a plurality of arc lamps (e.g., four Argon arc lamps) as light sources for intense millisecond exposure of the top surface of the semiconductor substrate—the so called "flash." The flash can be applied to the semiconductor substrate when the substrate has been heated to an intermediate temperature (e.g., about 450° C. to about 900° C.). A plurality of continuous mode arc lamps (e.g., two Argon arc lamps) can be used to heat the semiconductor substrate to the intermediate temperature. In some embodiments, the heating of the semiconductor substrate to the intermediate temperature is accomplished through the bottom surface of the semiconductor substrate at a ramp rate which heats the entire bulk of the wafer.

Figure 2:
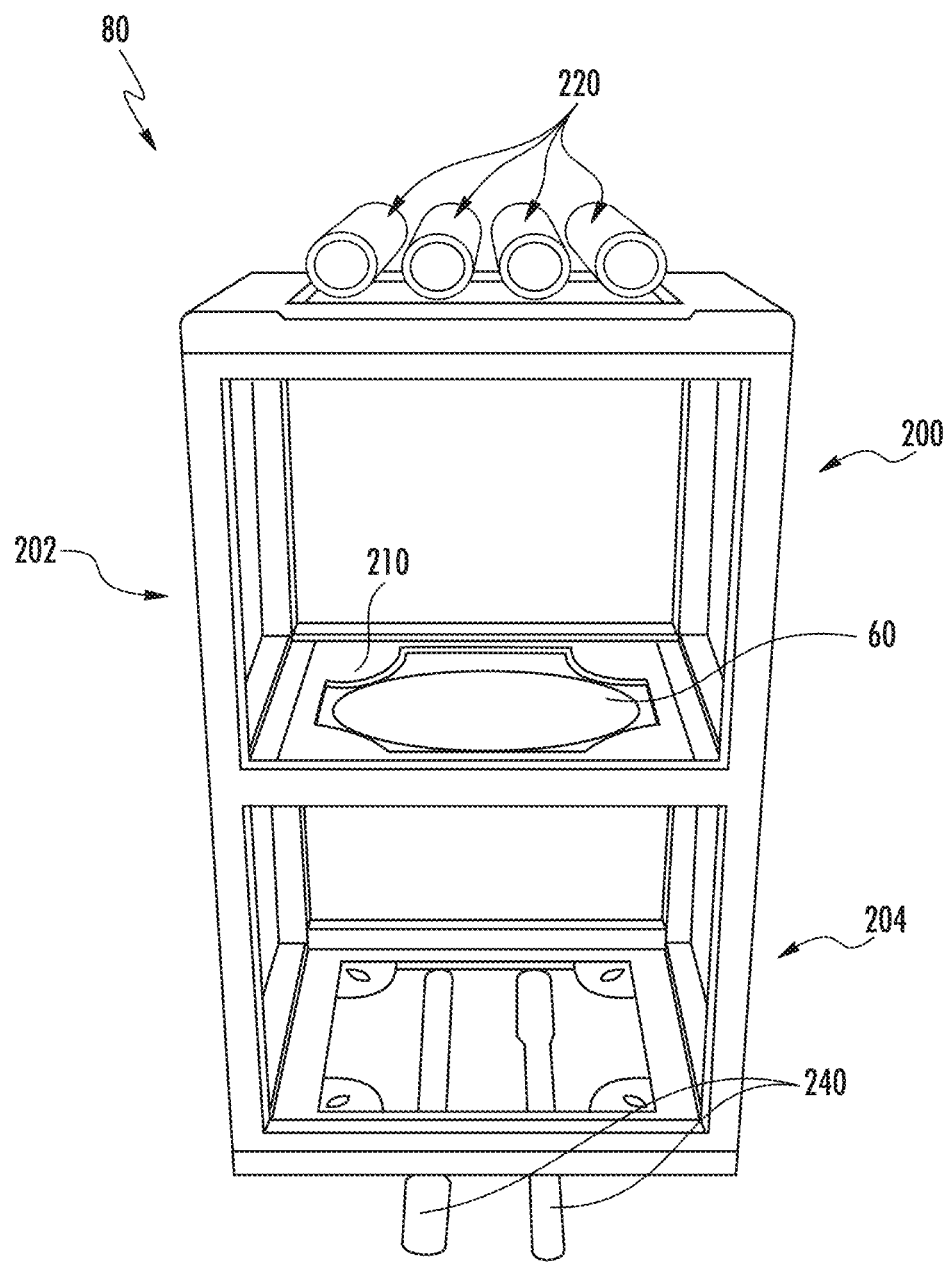
FIG. 2 depicts an example perspective view of a portion of an example millisecond anneal system according to example embodiments of the present disclosure.
Figure 3:
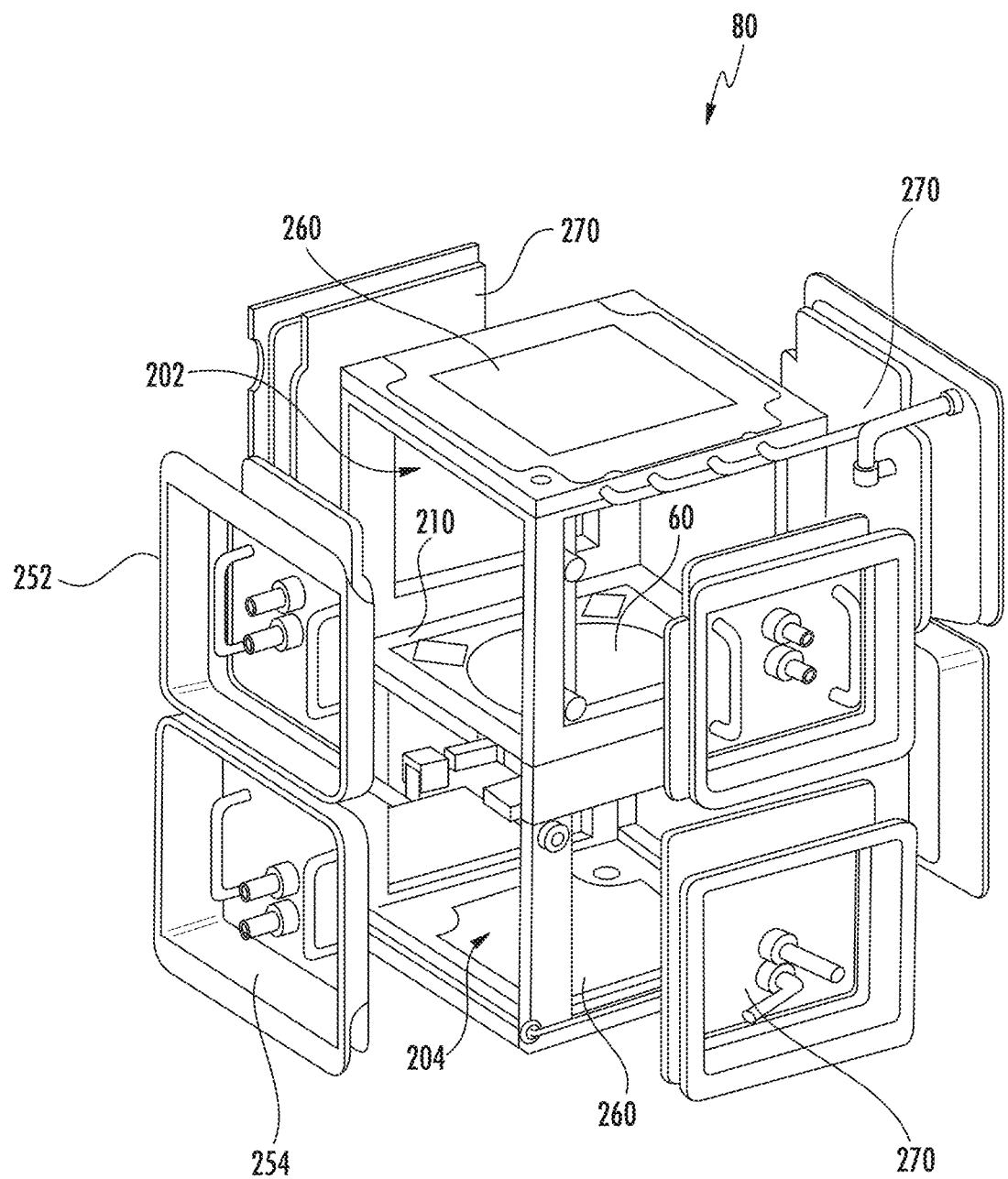
FIG. 3 depicts an exploded view of an example millisecond anneal system according to example embodiments of the present disclosure.
Figure 4:
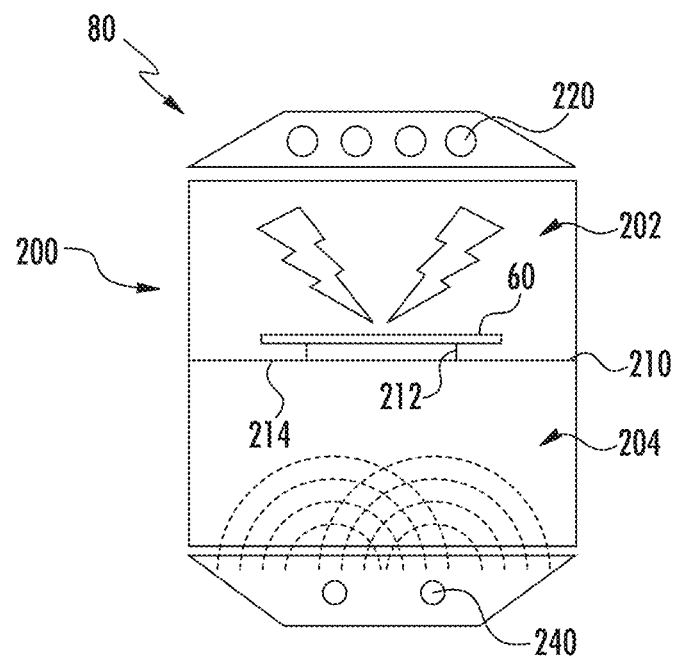
FIG. 4 depicts a cross-sectional view of an example millisecond anneal system according to example embodiments of the present disclosure.

FIGS. 2 to 5 depict various aspects of an example millisecond anneal system 80 according to example embodiments of the present disclosure. As shown in FIGS. 2-4, a millisecond anneal system 80 can include a process chamber 200. The process chamber 200 can be divided by a wafer plane plate 210 into a top chamber 202 and a bottom chamber 204. A semiconductor substrate 60 (e.g., a silicon wafer) can be supported by support pins 212 (e.g., quartz support pins) mounted to a wafer support plate 214 (e.g., quartz glass plate inserted into the wafer plane plate 210).

As shown in FIGS. 2 and 4, the millisecond anneal system 80 can include a plurality of arc lamps 220 (e.g., four Argon arc lamps) arranged proximate the top chamber 202 as light sources for intense millisecond long exposure of the top surface of the semiconductor substrate 60—the so called "flash." The flash can be applied to the semiconductor substrate when the substrate has been heated to an intermediate temperature (e.g., about 450° C. to about 900° C.).

A plurality of continuous mode arc lamps 240 (e.g., two Argon arc lamps) located proximate the bottom chamber 204 can be used to heat the semiconductor substrate 60 to the intermediate temperature. In some embodiments, the heating of the semiconductor substrate 60 to the intermediate temperature is accomplished from the bottom chamber 204 through the bottom surface of the semiconductor substrate at a ramp rate which heats the entire bulk of the semiconductor substrate 60.

As shown in FIG. 3, the light to heat the semiconductor substrate 60 from the bottom arc lamps 240 (e.g., for use in heating the semiconductor substrate to an intermediate temperature) and from the top arc lamps 220 (e.g., for use in providing millisecond heating by flash) can enter the processing chamber 200 through water windows 260 (e.g., water cooled quartz glass windows). In some embodiments, the water windows 260 can include a sandwich of two quartz glass panes between which an about a 4 mm thick layer of water is circulating to cool the quartz panes and to provide an optical filter for wavelengths, for instance, above about 1400 nm.

Figure 5:
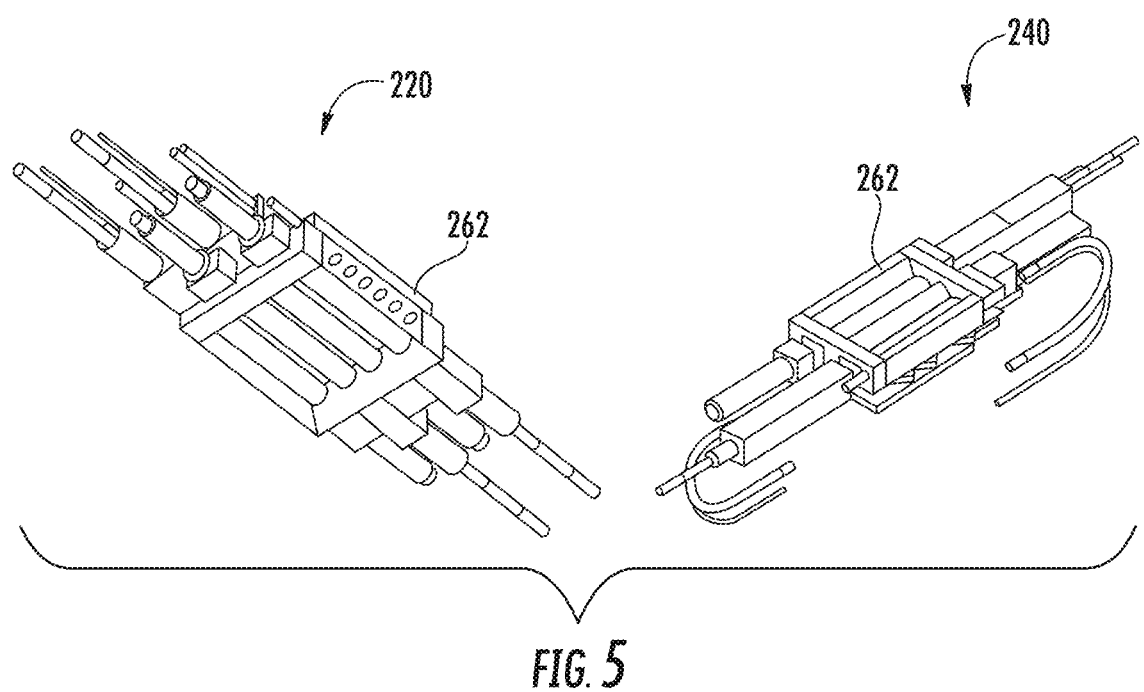
FIG. 5 depicts a perspective view of example lamps used in a millisecond anneal system according to example embodiments of the present disclosure.

As further illustrated in FIG. 3, process chamber walls 250 can include reflective mirrors 270 for reflecting the heating light. The reflective mirrors 270 can be, for instance, water cooled, polished aluminum panels. In some embodiments, the main body of the arc lamps used in the millisecond anneal system can include reflectors for lamp radiation. For instance, FIG. 5 depicts a perspective view of both a top lamp array 220 and a bottom lamp array 240 that can be used in the millisecond anneal system 200. As shown, the main body of each lamp array 220 and 240 can include a reflector 262 for reflecting the heating light. These reflectors 262 can form a part of the reflecting surfaces of the process chamber 200 of the millisecond anneal system 80.

The temperature uniformity of the semiconductor substrate can be controlled by manipulating the light density falling onto different regions of the semiconductor substrate. In some embodiments, uniformity tuning can be accomplished by altering the reflection grade of small size reflectors to the main reflectors and/or by use of edge reflectors mounted on the wafer support plane surrounding the wafer.

Figure 6:
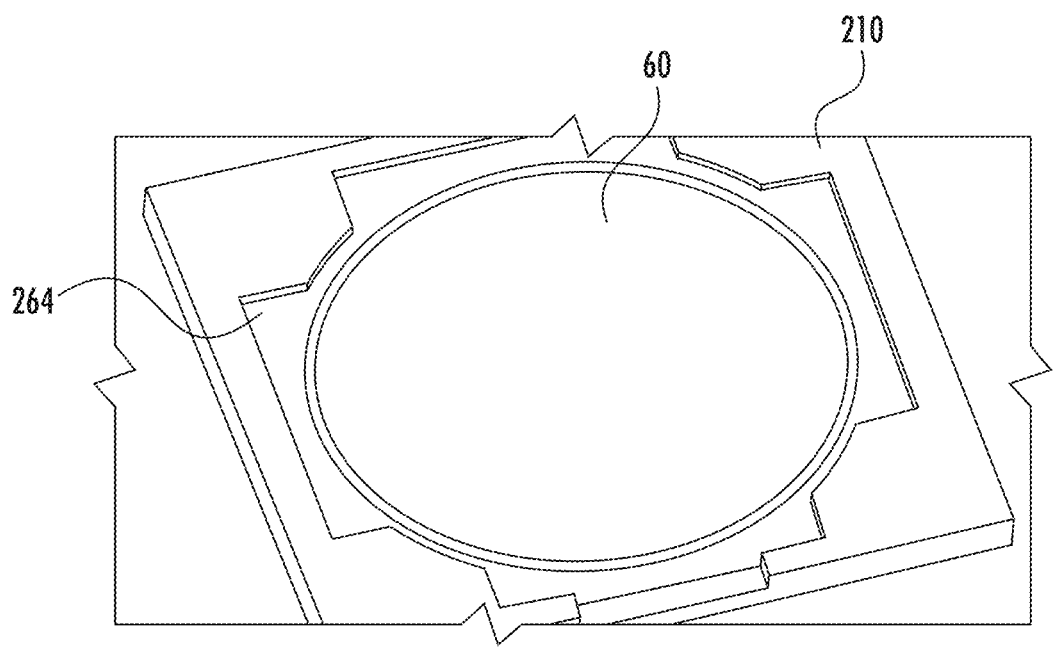
FIG. 6 depicts example edge reflectors used in a wafer plane plate of a millisecond anneal system according to example embodiments of the present disclosure.

For instance, edge reflectors can be used to redirect light from the bottom lamps 240 to an edge of the semiconductor substrate 60. As an example, FIG. 6 depicts example edge reflectors 264 that form a part of the wafer plane plate 210 that can be used to direct light from the bottom lamps 240 to the edge of the semiconductor substrate 60. The edge reflectors 264 can be mounted to the wafer plane plate 210 and can surround or at least partially surround the semiconductor substrate 60.

Figure 7:
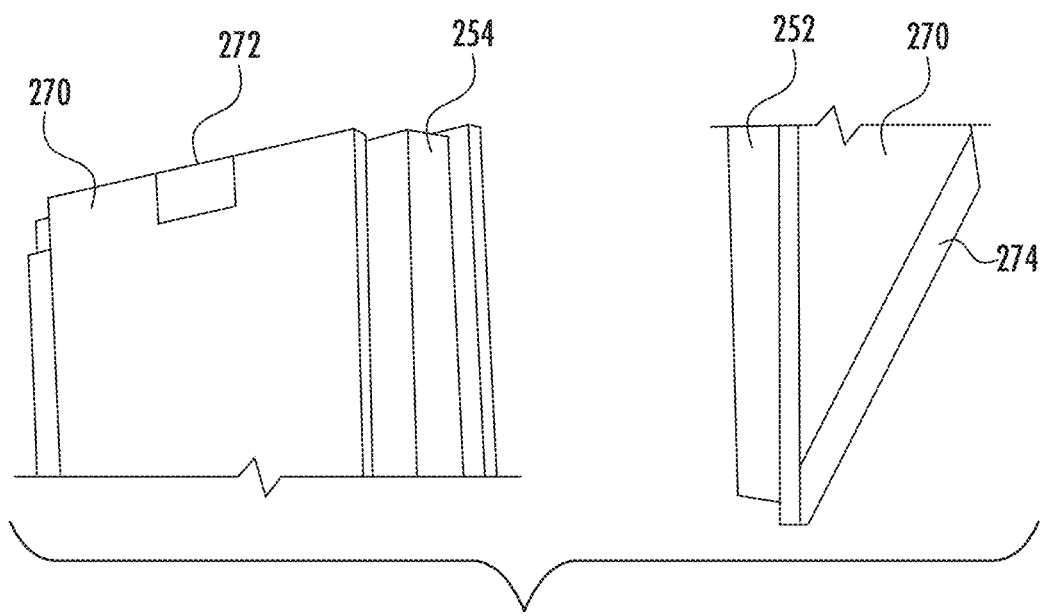
FIG. 7 depicts example reflectors that can be used in a millisecond anneal system according to example embodiments of the present disclosure.

In some embodiments, additional reflectors can also be mounted on chamber walls near the wafer plane plate 210. For example, FIG. 7 depicts example reflectors that can be mounted to the process chamber walls that can act as reflector mirrors for the heating light. More particularly, FIG. 7 shows an example wedge reflector 272 mounted to lower chamber wall 254. FIG. 7 also illustrates a reflective element 274 mounted to reflector 270 of an upper chamber wall 252. Uniformity of processing of the semiconductor substrate 60 can be tuned by changing the reflection grade of the wedge reflectors 272 and/or other reflective elements (e.g., reflective element 274) in the processing chamber 200.

Figure 8:
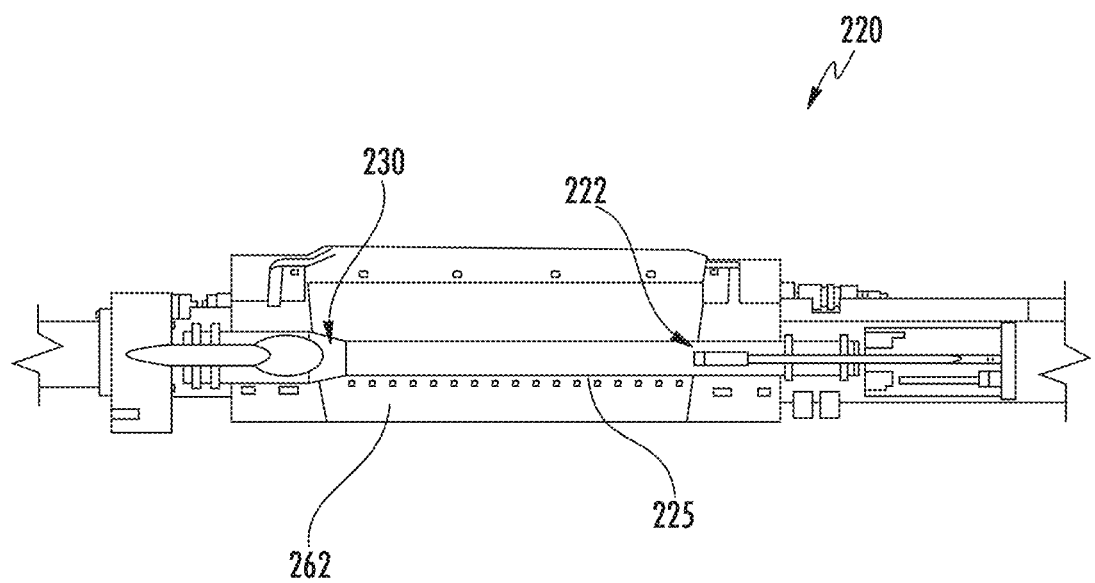
FIG. 8 depicts an example arc lamp that can be used in a millisecond anneal system according to example embodiments of the present disclosure.
Figure 9:
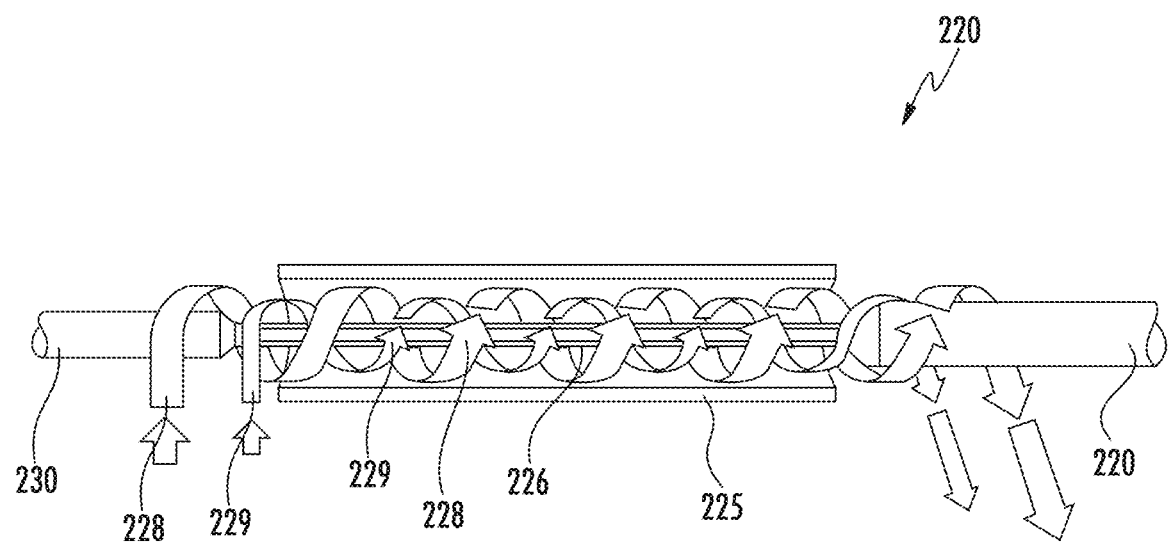
FIGS. 9-10 depict the operation of an example arc lamp according to example embodiments of the present disclosure.

FIGS. 8-11 depict aspects of example upper arc lamps 220 that can be used as light sources for intense millisecond long exposure of the top surface of the semiconductor substrate 60 (e.g., the "flash"). For instance, FIG. 8 depicts a cross-sectional view of an example arc lamp 220. The arc lamp 220 can be, for instance, an open flow arc lamp, where pressurized Argon gas (or other suitable gas) is converted into a high pressure plasma during an arc discharge. The arc discharge takes place in a quartz tube 225 between a negatively charged cathode 222 and a spaced apart positively charged anode 230 (e.g., spaced about 300 mm apart). As soon as the voltage between the cathode 222 and the anode 230 reaches a breakdown voltage of Argon (e.g., about 30 kV) or other suitable gas, a stable, low inductive plasma is formed which emits light in the visible and UV range of the electromagnetic spectrum. As shown in FIG. 9, the lamp can include a lamp reflector 262 that can be used to reflect light provided by the lamp for processing of the semiconductor substrate 60.

Figure 10:
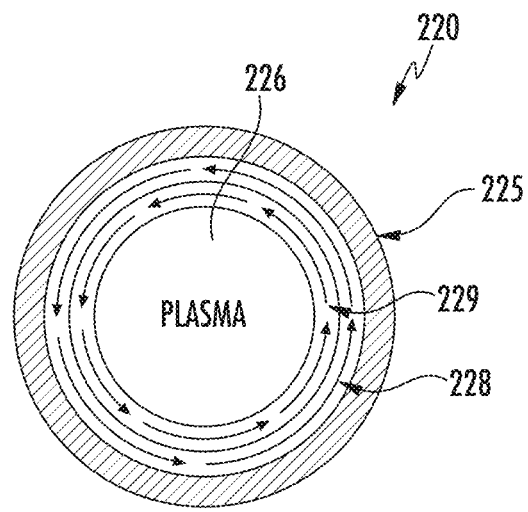
Figure 11:
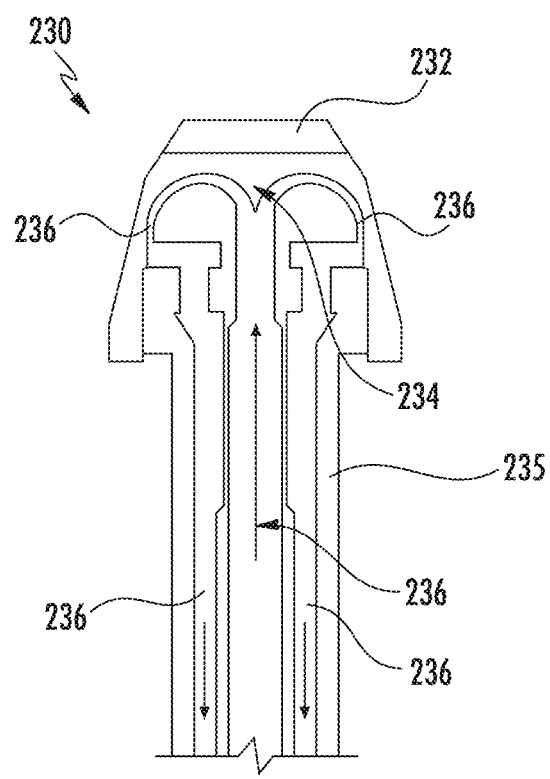
FIG. 11 depicts a cross-sectional view of an example electrode according to example embodiments of the present disclosure.

FIGS. 10 and 11 depict aspects of example operation of an arc lamp 220 in millisecond anneal system 80 according to example embodiments of the present disclosure. More particularly, a plasma 226 is contained within a quartz tube 225 which is water cooled from the inside by a water wall 228. The water wall 228 is injected at high flow rates on the cathode end of the lamp 200 and exhausted at the anode end. The same is true for the Argon gas 229, which is also entering the lamp 220 at the cathode end and exhausted from the anode end. The water forming the water wall 228 is injected perpendicular to the lamp axis such that the centrifugal action generates a water vortex. Hence, along the center line of the lamp a channel is formed for the Argon gas 229. The Argon gas column 229 is rotating in the same direction as the water wall 228. Once a plasma 226 has formed, the water wall 228 is protecting the quartz tube 225 and confining the plasma 226 to the center axis. Only the water wall 228 and the electrodes (cathode 230 and anode 222) are in direct contact with the high energy plasma 226.

FIG. 11 depicts a cross sectional view of an example electrode (e.g., cathode 230) used in conjunction with an arc lamp according to example embodiments of the present disclosure. FIG. 11 depicts a cathode 230. However, a similar construction can be used for the anode 222.

In some embodiments, as the electrodes experience a high heat load, one or more of the electrodes can each include a tip 232. The tip can be made from tungsten. The tip can be coupled to and/or fused to a water cooled copper heat sink 234. The copper heat sink 234 can include at least a portion the internal cooling system of the electrodes (e.g., one or more water cooling channels 236. The electrodes can further include a brass base 235 with water cooling channels 236 to provide for the circulation of water or other fluid and the cooling of the electrodes.

The arc lamps used in example millisecond anneal systems according to aspects of the present disclosure can be an open flow system for water and Argon gas. However, for conservation reasons, both media can be circulated in a close loop system in some embodiments.

Figure 12:
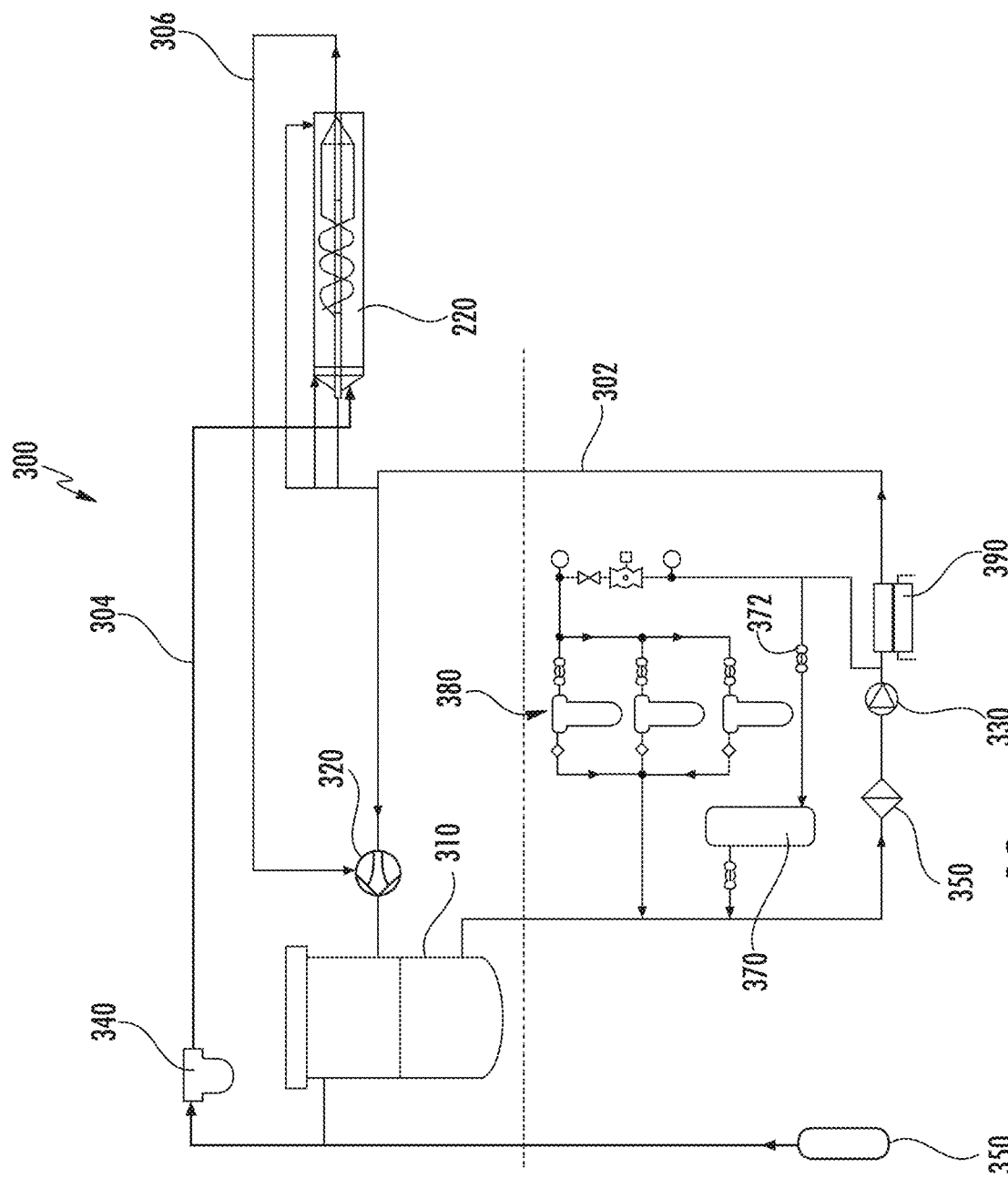
FIG. 12 depicts an example closed loop system for supplying water and gas (e.g., Argon gas) to example arc lamps used in a millisecond anneal system according to example embodiments of the present disclosure.

FIG. 12 depicts an example closed loop system 300 for supplying water and Argon gas needed to operate the open flow Argon arc lamps used in millisecond anneal systems according to example embodiments of the present disclosure.

More particularly, high purity water 302 and Argon 304 is fed to the lamp 220. The high purity water 302 is used for the water wall and the cooling of the electrodes. Leaving the lamp is a gas/water mixture 306. This water/gas mixture 306 is separated into gas free water 302 and dry Argon 304 by separator 310 before it can be re-fed to the inlets of the lamp 220. To generate the required pressure drop across the lamp 220, the gas/water mixture 306 is pumped by means of a water driven jet pump 320.

A high power electric pump 330 supplies the water pressure to drive the water wall in the lamp 220, the cooling water for the lamp electrodes, and the motive flow for the jet pump 320. The separator 310 downstream to the jet pump 320 can be used extracting the liquid and the gaseous phase from the mixture (Argon). Argon is further dried in a coalescing filter 340 before it re-enters the lamp 220. Additional Argon can be supplied from Argon source 350 if needed.

The water is passing through one or more particle filters 350 to remove particles sputtered into the water by the arc. Ionic contaminations are removed by ion exchange resins. A portion of water is run through mixed bed ion exchange filters 370. The inlet valve 372 to the ion exchange bypass 370 can be controlled by the water resistivity. If the water resistivity drops below a lower value the valve 372 is opened, when it reaches an upper value the valve 372 is closed. The system can contain an activated carbon filter bypass loop 380 where a portion of the water can be additionally filtered to remove organic contaminations. To maintain the water temperature, the water can pass through a heat exchanger 390.

Figure 13:
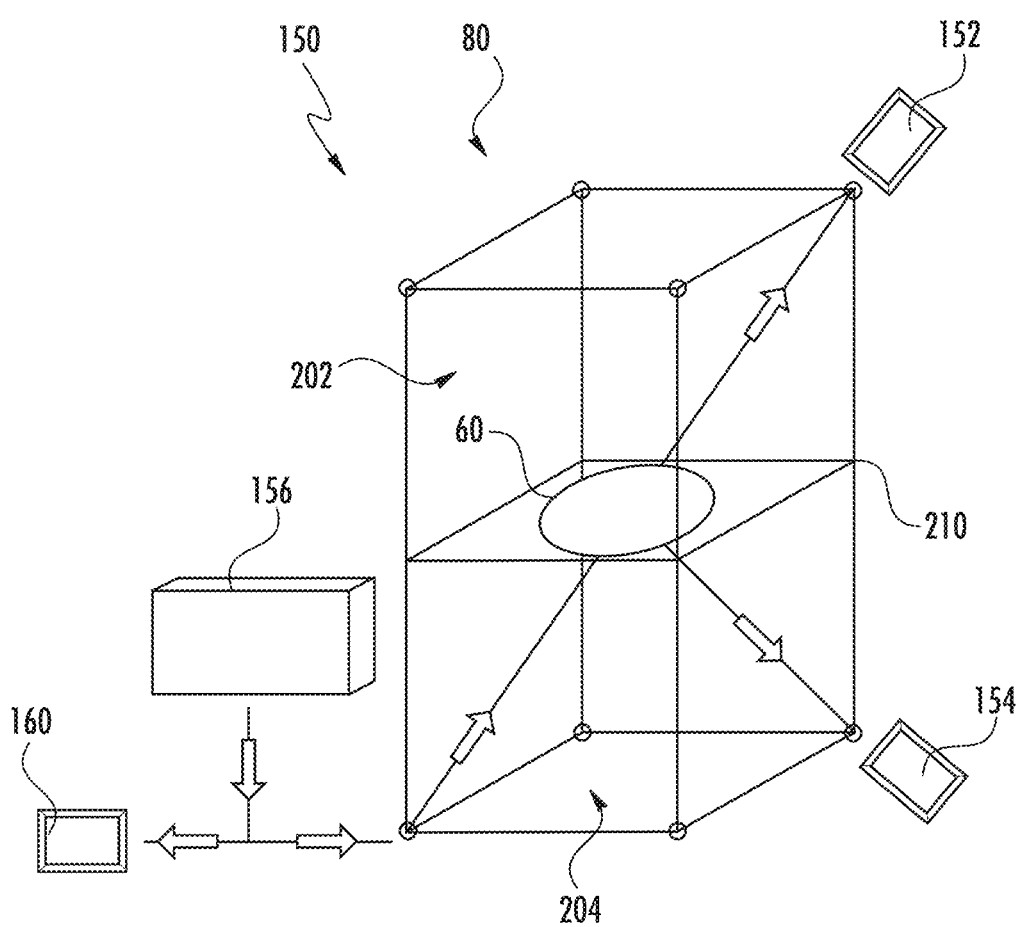
FIG. 13 depicts an example temperature measurement system for a millisecond anneal system according to example embodiments of the present disclosure.

Millisecond anneal systems according to example embodiments of the present disclosure can include the ability to independently measure temperature of both surfaces (e.g., the top and bottom surfaces) of the semiconductor substrate. FIG. 13 depicts an example temperature measurement system 150 for millisecond anneal system 200.

A simplified representation of the millisecond anneal system 200 is shown in FIG. 13. The temperature of both sides of a semiconductor substrate 60 can be measured independently by temperature sensors, such as temperature sensor 152 and temperature sensor 154. Temperature sensor 152 can measure a temperature of a top surface of the semiconductor substrate 60. Temperature sensor 154 can measure a bottom surface of the semiconductor substrate 60. In some embodiments, narrow band pyrometric sensors with a measurement wavelength of about 1400 nm can be used as temperature sensors 152 and/or 154 to measure the temperature of, for instance, a center region of the semiconductor substrate 60. In some embodiments, the temperature sensors 152 and 154 can be ultra-fast radiometers (UFR) that have a sampling rate that is high enough to resolve the millisecond temperature spike cause by the flash heating.

The readings of the temperature sensors 152 and 154 can be emissivity compensated. As shown in FIG. 13, the emissivity compensation scheme can include a diagnostic flash 156, a reference temperature sensor 158, and the temperature sensors 152 and 154 configured to measure the top and bottom surface of the semiconductor wafers. Diagnostic heating and measurements can be used with the diagnostic flash 156 (e.g., a test flash). Measurements from reference temperature sensor 158 can be used for emissivity compensation of temperature sensors 152 and 154.

In some embodiments, the millisecond anneal system 200 can include water windows. The water windows can provide an optical filter that suppresses lamp radiation in the measurement band of the temperature sensors 152 and 154 so that the temperature sensors 152 and 154 only measure radiation from the semiconductor substrate.

The readings of the temperature sensors 152 and 154 can be provided to a processor circuit 160. The processor circuit 160 can be located within a housing of the millisecond anneal system 200, although alternatively, the processor circuit 160 may be located remotely from the millisecond anneal system 200. The various functions described herein may be performed by a single processor circuit if desired, or by other combinations of local and/or remote processor circuits.

The readings of the temperature sensors 152 and 154 can be used by the processor circuit 160 to determine a temperature profile across the substrate. The temperature profile can provide a measure of the temperature of the substrate at various locations across the surface of the substrate. The temperature profile can provide a measure of thermal uniformity of the substrate during processing. As discussed in detail below, data indicative of a temperature profile can be used for improving thermal uniformity by (1) changing the pressure inside the processing chamber of the millisecond anneal system; (2) manipulating the irradiation distribution by way of the refracting effect of a water window in the millisecond anneal system; (3) angular positioning of the wafer; and/or (4) configuring the shape of the reflectors used in the millisecond anneal system.

Example Uniformity Improvement Through Chamber Pressure Control

According to example aspects of the present disclosure, the temperature uniformity of a semiconductor substrate can be improved during processing in a millisecond anneal system by changing the pressure inside the process chamber. The pressure inside the process chamber can influence a flow pattern of process gas inside the chamber, changing the convective cooling contribution on different regions of the wafer.

The processing chamber in a millisecond anneal system can be operated at atmospheric pressure. The processing chamber can be sealed against the surrounding air to realize an ultra-pure gas ambient inside the chamber. The pressure inside the chamber can be modified within the limits given by the mechanical stability of the quartz plates of the water window. The allowable pressure range can be, for instance, about +2 kPa to about −2 kPa pressure over atmosphere.

For instance, in some embodiments, a process for thermally treating a substrate in a millisecond anneal system can include obtaining data indicative of a temperature profile associated with one or more substrates during processing in a millisecond anneal system. A temperature profile can provide a measure of thermal uniformity of the substrate during processing. The temperature profile can provide a temperature at various points on the substrate. The data indicative of the temperature profile for one or more substrates can be analyzed to determine any non-uniformities in the temperature profile during process. To address the non-uniformities, a pressure in the processing chamber can be adjusted to affect the temperature uniformity across one or more substrates.

In some embodiments, the data indicative of the temperature profile can be obtained for a substrate during processing. Non-uniformities identified in the temperature profile can trigger the adjustment of the pressure during processing of the semiconductor substrate. In this way, a closed loop control of pressure based on the measured temperature profile can be used to adjust the temperature uniformity of a wafer during processing.

Figure 14:
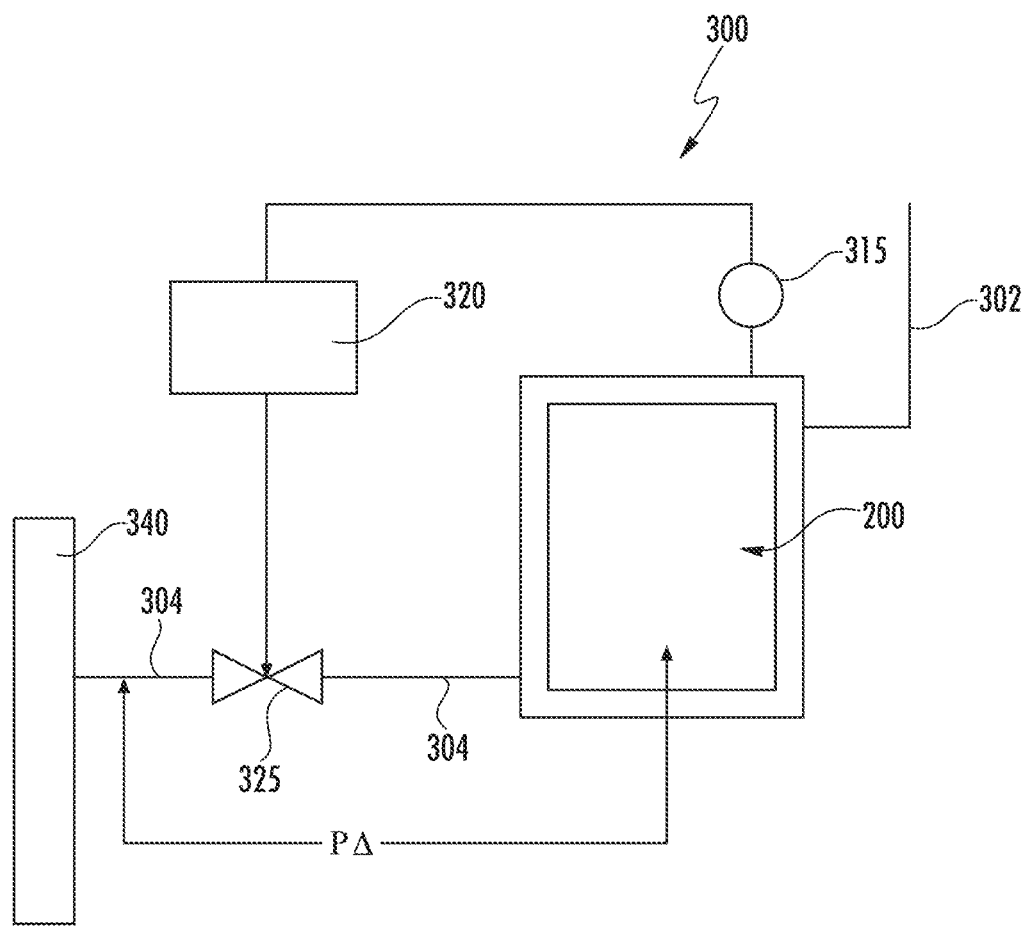
FIG. 14 depicts an example gas flow system for adjusting pressure in the processing chamber of a millisecond anneal system according to example embodiments of the present disclosure.

FIG. 14 depicts an example gas flow system for adjusting pressure in the processing chamber 200 of a millisecond anneal system according to example embodiments of the present disclosure. The process chamber 200 can be an open flow system, where process gas is constantly entering the chamber from gas inlet 302 through gas inlet ports located in the top corners of the process chamber 200. The process gas can leave the process chamber 200 chamber through vent ports located in the bottom corners of the process chambers. Downstream of the vent ports, the four vent lines can be combined to a single downstream line 304. The downstream line 304 can be connected to a downstream exhaust duct 340. The downstream duct 340 can provide a pressure differential PA relative to the process chamber 200 necessary to vent the process gas from the chamber 200. By changing this pressure differential PA, the pressure in the processing chamber can be adjusted.

In some embodiments, the pressure differential PA can be adjusted by a controller 320. The controller 320 can be any suitable control device, such as one or more processor circuits executing computer-readable instructions stored in one or more memory devices. A control variable for the controller 320 can be a pressure sensor 315 mounted to the chamber. The pressure sensor 315 can measure the pressure inside the chamber 200 and can send signals indicative of the pressure to the controller 320 over a suitable communication medium.

The actuator of the controller 320 can be a valve 325 (e.g. a butterfly valve) in the vent manifold, changing the flow resistance and thus the pressure differential of the downstream line 304. Low flow resistance can lower the chamber pressure. High flow resistance can increase the chamber pressure. The pressure set-point for the controller 320 can be defined by a user, for instance, based on a temperature profile across the substrate. The controller 320 can be configured to control the pressure based on signals from the pressure sensor to achieve the pressure-set point. In some embodiments, the pressure differential can be adjusted by passive mechanical restrictions (e.g. orifices, dampers, or baffles) inside the vent line, or by setting the external exhaust duct pressure.

The pressure inside the process chamber can influence a flow pattern of process gas inside the chamber. Thus, the convective cooling contribution on different regions of the wafer can be adjusted by adjusting the pressure inside the process chamber according to example embodiments of the present disclosure.

Adjusting the pressure can also affect the irradiation distribution of lamp light provided through water windows in the millisecond anneal system. For instance, in some embodiments, the temperature uniformity of a semiconductor substrate can be improved during processing in a millisecond anneal system by adjusting the irradiance distribution based on the refracting effect of a water window used in the millisecond anneal system. A water window in its normal state is a plane-parallel plate with a stack sequence of: (1) quartz; (2) water; (3) quartz. Water can flow through a sandwich of two quartz plates. Warping the stack can cause the water window to act as a lens for the lamp light passing through the window, adjusting the irradiation distribution through the water window.

In some embodiments, the warping of the water window can be accomplished by increasing or decreasing the pressure inside the chamber. As discussed above, the pressure inside the chamber can be modified within the limits given by the mechanical stability of the quartz plates of the water window. The allowable pressure range can be, for instance, about +2 kPa to about −2 kPa pressure over atmosphere. As the cooling water flowing inside the water window is at constant pressure very close to the atmospheric pressure, a pressure change inside the chamber an affect the inner quartz plate of the water window. This can results in a thickness change of the water layer center to edge.

Figure 15:
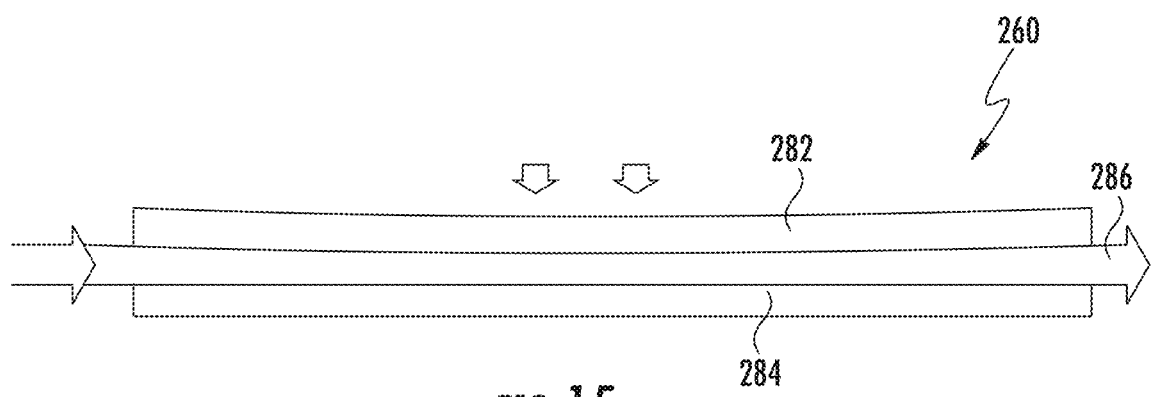
FIG. 15 depicts a changing shape of a water window in a millisecond anneal system according to example embodiments of the present disclosure.
Figure 16:
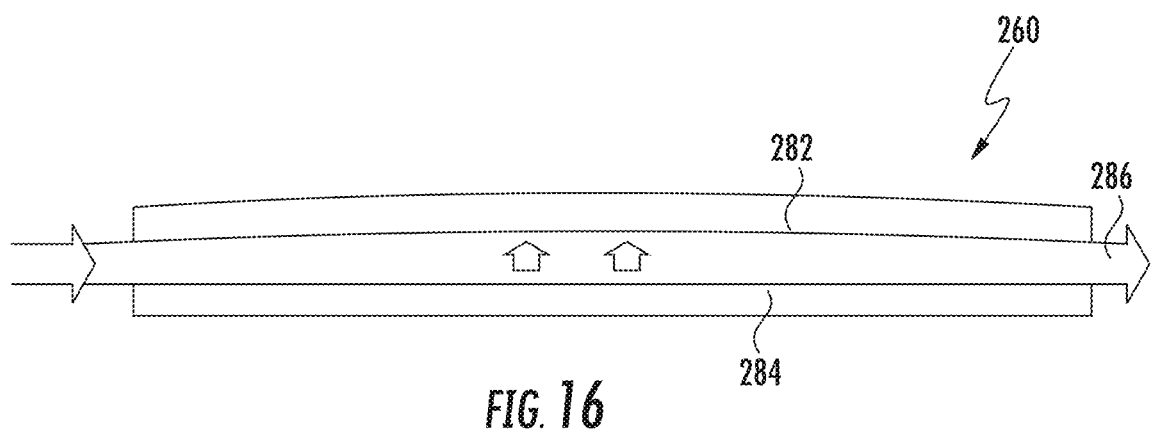
FIG. 16 depicts a changing shape of a water window in a millisecond anneal system according to example embodiments of the present disclosure.

More particularly, FIGS. 15 and 16 illustrate a water window 260 having an inner plate 282 and an outer plate 284. The inner plate 282 and the outer plate 284 can be formed from, for instance, quartz. Water can flow between the inner plate 282 and the outer plate 284. The inner plate 282 can be disposed closer to the processing chamber of a millisecond anneal system relative to the outer plate 284.

As shown in FIG. 15, with a positive chamber pressure relative to atmosphere, the inner 282 of the water window 260 is bending outwards (e.g., away from the process chamber), resulting in a convex layer of water with a defocusing effect on light. As shown in FIG. 16, with a negative chamber pressure relative to atmosphere, the inner plate 282 of the water window 260 is bending inwards (e.g. toward the processing chamber), resulting in a convex layer of water with a focusing effect on light.

Example Uniformity Improvement Through Angular Positioning of Wafer

According to example aspects of the present disclosure, the temperature uniformity of a patterned device wafer (e.g., a product wafer) during processing in a millisecond anneal system can be improved by angular wafer positioning. A product wafer can sometimes contain several hundreds of dies arranged in form of an array on the front surface of the wafer.

Figure 17:
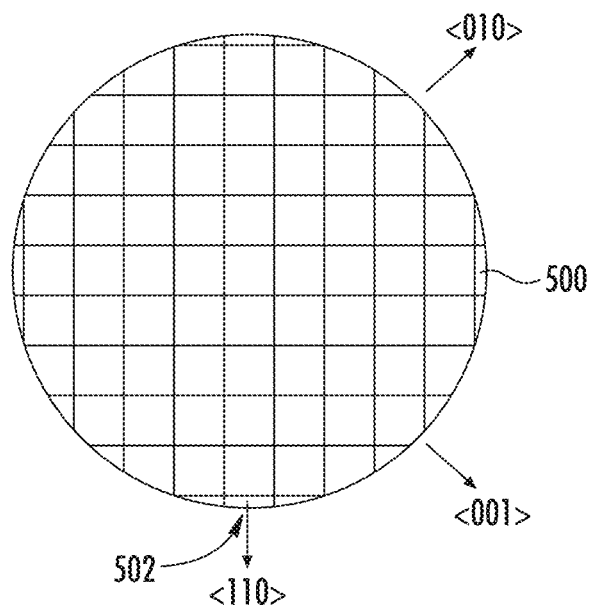
FIG. 17 depicts an example product wafer with devices in an array arrangement.

For instance, FIG. 17 depicts an example product wafer 500 with devices in an array arrangement. As silicon is a crystal, the dies can be oriented along the main axis of the crystal lattice. Most commonly, the wafer surface is cut along the [100] plane of the silicon lattice. The wafer has a notch 502 marking the <110> crystal lattice orientation. The die arrangement results in a laterally varying absorption ability of light. Hence the array of dies imposes a non-uniform light absorption property onto the wafer surface.

Figure 18:
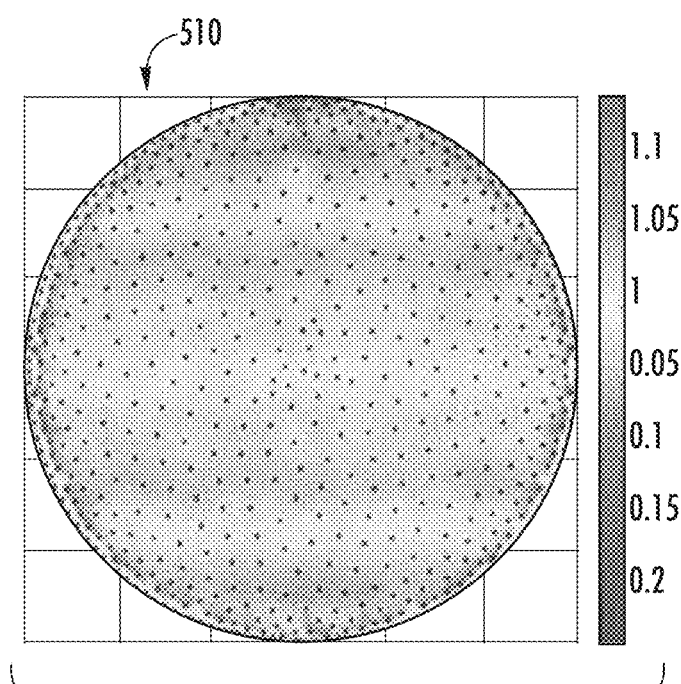
FIG. 18 depicts an example residual non-uniformity of the irradiation of a wafer in a millisecond anneal system.

FIG. 18 depicts a representation 510 of example residual non-uniformity of the irradiation of a wafer in a millisecond anneal system. As shown in FIG. 18, the chamber can have a residual, inherent irradiation non-uniformity giving rise to a lateral wafer-temperature non-uniformity. This inherent irradiation non-uniformity can result, for instance, from the orientation of lamps, location of reflectors, and other components of the millisecond anneal system.

Millisecond anneal systems according to example aspects of the present disclosure can use a stationary, non-rotating wafer support arrangement. Therefore, the angular wafer orientation can be used to optimize or improve the temperature uniformity by aligning based at least in part on the irradiation pattern inherent to the chamber.

More particularly, in some embodiments, a process for thermally treating a substrate in a millisecond anneal system can include obtaining data indicative of a temperature profile associated with one or more substrates during processing in a millisecond anneal system. The data indicative of the temperature profile for one or more substrates can be analyzed to determine any non-uniformities in the temperature profile during processing. To address the non-uniformities, the angular positioning of one or more wafers in the processing chamber can be adjusted to affect the temperature uniformity across the one or more substrates.

Figure 19:
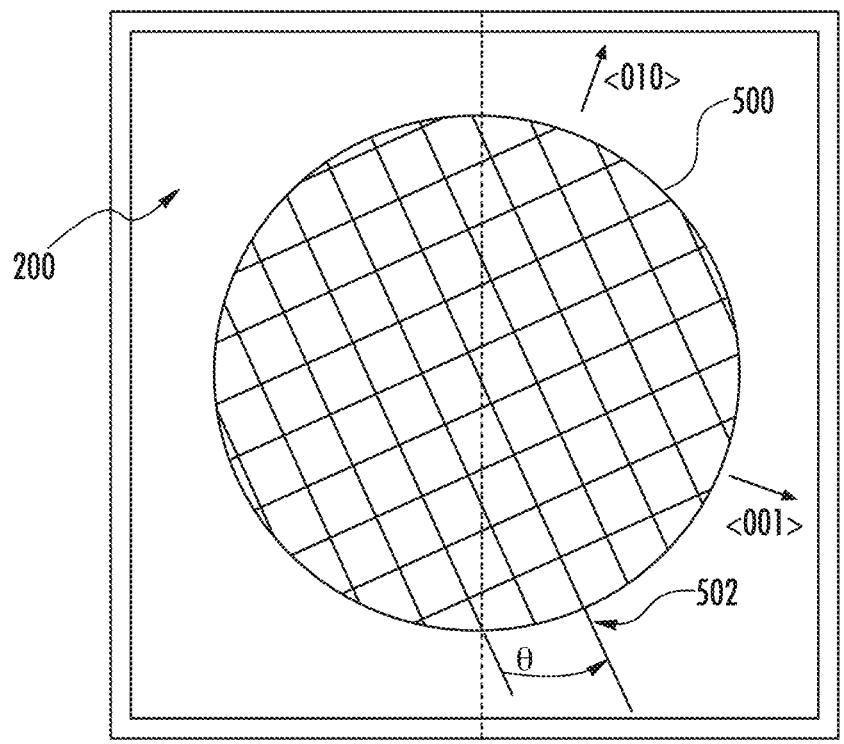
FIG. 19 depicts a product wafer located inside a processing chamber at a different angular orientation according to example embodiments of the present disclosure.

FIG. 19 depicts a product wafer 500 located inside a processing chamber 200. As shown, the wafer 500 can be placed at different angular orientations relative to the chamber and to the lamps. In the example, of FIG. 19, the wafer 500 is placed so that notch 502 is at notch alignment angle θ. Accordingly, interaction between absorption pattern and irradiation pattern can be enhanced by adjusting the angular orientation of the wafer 500.

In some embodiments, product wafers can be notch aligned before being loaded onto the handling system of the millisecond anneal system. The notch alignment angle θ can determine the angular orientation inside the chamber. Wafer orientation can be measured based on the notch position relative to the chamber main axis (e.g., given by the walls). In other embodiments, the notch alignment can be performed inside the processing chamber, for instance, by a notch alignment station or by a notch aligner integrated to a robot.

In some implementations, wafers can be supported by quartz pins mounted to a wafer support plate. The number of pins used for supporting the wafer can vary between three up to six or more. A common wafer support scheme uses four pins arranged as a square with equal distance to the wafer center. Typically the pins can cause a localized cold spot. Also the pins can induce a mechanical stress pattern. By angular orientation of the wafer relative to the pins, the negative impacts of the pins can be moved to more favorable regions of the wafer. Also, by off-setting the points of contact from the main lattice axis, wafer stress can be mitigated.

Figure 20:
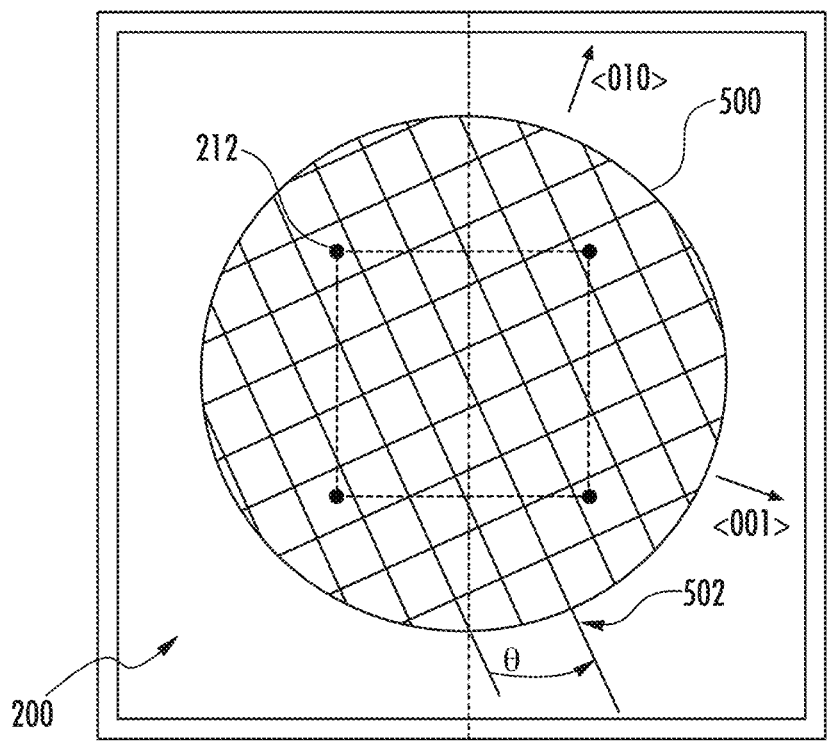
FIG. 20 depicts a product wafer located inside a processing chamber at different angular orientations relative to support pins according to example embodiments of the present disclosure.

For instance, FIG. 20 depicts a wafer 500 inside a processing chamber 200 with the location of support pins 212 relative the wafer 500 shown. Angular orientation of the wafer 500 relative to the pins 212 can reduce the influence of the pins 212 by positioning the pins 212 at different locations relative to the wafer 500.

Uniformity Improvement through Shape and Position of Reflectors

According to example embodiments of the present disclosure, the temperature uniformity of a semiconductor substrate can be improved during processing in a millisecond anneal system based at least in part the shape of one or more reflectors in the processing chamber of the millisecond anneal system. For instance, a top wedge reflector and/or one or more edge reflectors can have a shape and/or configuration designed to improve thermal uniformity. Small-sized reflectors can be used to reduce the residual non-uniformity of the processing chambers in millisecond anneal system.

In some embodiments, a process for thermally treating a substrate in a millisecond anneal system can include obtaining data indicative of a temperature profile associated with one or more substrates during processing in a millisecond anneal system. The data indicative of the temperature profile for one or more substrates can be analyzed to determine any non-uniformities in the temperature profile during process. To address the non-uniformities, the shape, configuration, and/or position of one or more reflectors in the processing chamber can be adjusted to affect the temperature uniformity across the one or more substrates.

Figure 21:
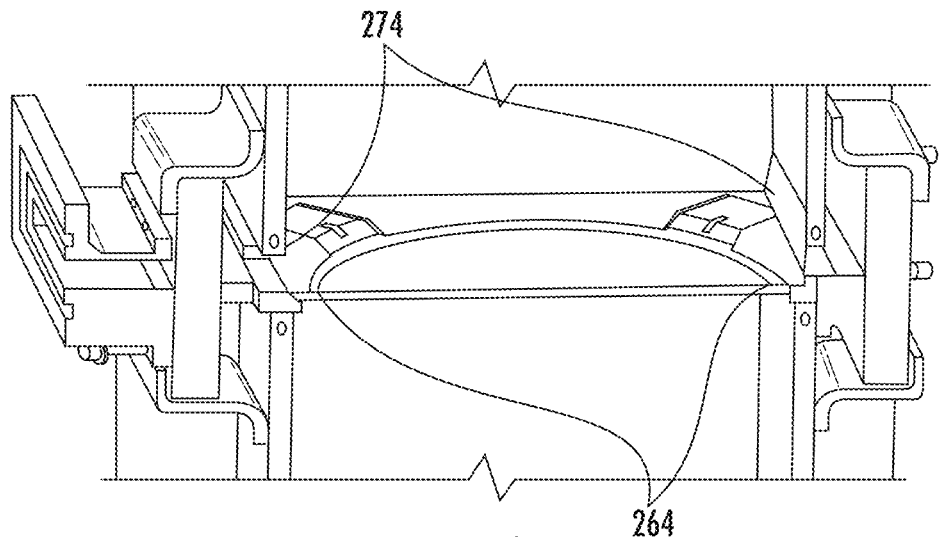
FIG. 21 depicts a cross sectional view showing the locations of top wedge reflectors and edge reflectors in a processing chamber in a millisecond anneal system according to example embodiments.

FIG. 21 depicts a cross sectional view of a millisecond anneal system showing the locations of top wedge reflectors 274 and edge reflectors 264 in a processing chamber in a millisecond anneal system. The top wedge reflectors 274 can be located on process chamber walls proximate the wafer plane plate. The top wedge reflectors 264 can be wedge shaped. The edge reflectors 264 can be located on the wafer plane plate and can surround a substrate during processing.

In some embodiments, there can be two top wedge reflectors 264 located on chamber walls in the top chamber portion of a processing chamber of a millisecond anneal system. The top edge reflectors 264 can be used to control the irradiation distribution perpendicular to the main axis of the lamps. In some embodiments, the wedge reflectors 264 can be mounted in the top half of the chamber along the bottom edge of the mirror panels facing the door and facing the rear of the chamber.

Typically, the wafer-temperature distribution has cold regions at the wafer edge, perpendicular to the lamp orientation. The size and magnitude of these cold spots can be impacted by the wedge reflectors 264. Millisecond anneal systems can have the ability to trigger the flash discharge of each top lamp individually. The main application of this ability is to shape the time-temperature profile of the flash event. A side effect of this ability is that the irradiation pattern changes locally with time, as the top lamps are at different positions relative to the wafer. This can have impact on the size of the cold spot on the wafer edge, depending on the trigger sequence of the lamps. Using wedges with optimized angles can compensate for these effects.

Figure 22A:
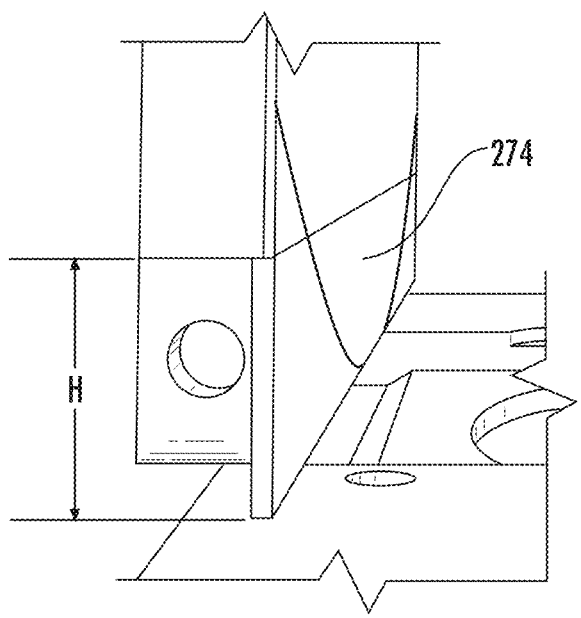
FIGS. 22(a) and 22(b) depicts example top wedges with varying wedge angles according to example embodiments of the present disclosure.
Figure 22B:
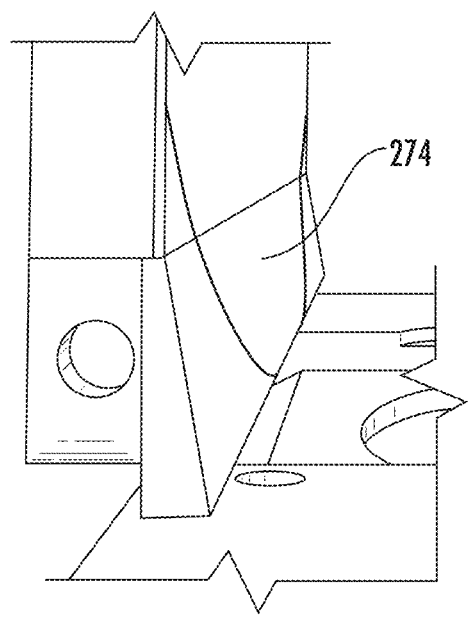

FIG. 22 depicts example top wedge reflectors 264 with varying wedge angles. More particularly, FIG. 22(a) depicts a top wedge reflector 264 with a 0° wedge angle. FIG. 22(b) depicts a top wedge reflector with a 10° wedge angle. By changing the wedge angle, the amount of light incident to the edge region can be controlled. In some embodiments, the wedge reflectors 264 can be mounted to a motor or other mechanical apparatus that can be configured to adjust the position and/or wedge angle of the wedge reflectors 264. For instance, a controller can adjust the wedge angle of the wedge reflectors in real time in response to temperature measurements of the substrate to provide for more uniform processing.

In some embodiments, the wedge angle can be pre-set by machining the parts. Optimization of the uniformity can be performed by mounting a suitable wedge with a selected wedge angle to the processing chamber. In another embodiment, the wedge angle can be set by inclining the wedge with shims, or by set screws. In some embodiments, the irradiation distribution is manipulated by additionally changing the wedge height and the wedge reflectivity.

FIG. 23 depicts the example improvement of irradiation distribution by adjusting the wedge angle of the top wedge from a 5° wedge angle to a 1° wedge angle. More particularly, FIG. 23(a) depicts a temperature profile of a wafer processed in a processing chamber having top wedge reflectors with a 5° wedge angle. As shown, the wafer can have cold spots 520 at the wafer edges due to reduced irradiance. FIG. 23(b) depicts a temperature profile of a wafer processed in a processing chamber having top wedge reflectors with a 1° wedge angle. As shown, the temperature at the wafer edges 525 is more uniform and the presence of cold spots have been reduced.

Figure 24:
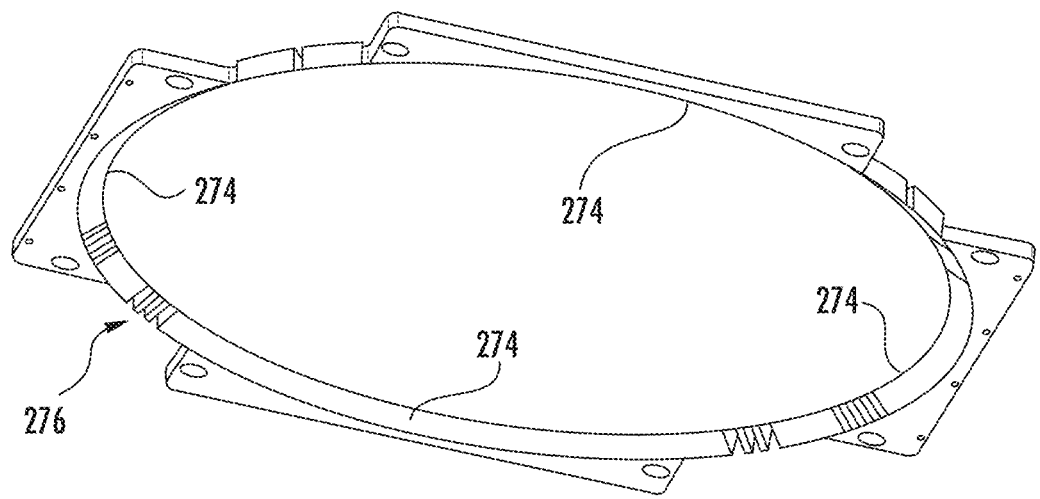
FIG. 24 depicts edge reflectors used in a millisecond anneal processing chamber according to example embodiments of the present disclosure.

Another way to manipulate the amount of irradiation at the wafer edge is by location, shape, and reflectivity of the edge reflectors 274. FIG. 24 depicts a perspective view of four edge reflectors 274 used in the processing chamber. The edge reflectors 274 can redirect light from the bottom lamps to the edge of the wafer. The reflectivity of the edge reflectors 274 can be modified by cutting slots 276 into the reflecting surface. The ratio of slot area to remaining reflector area determines the amount of reflectivity.

Figure 25:
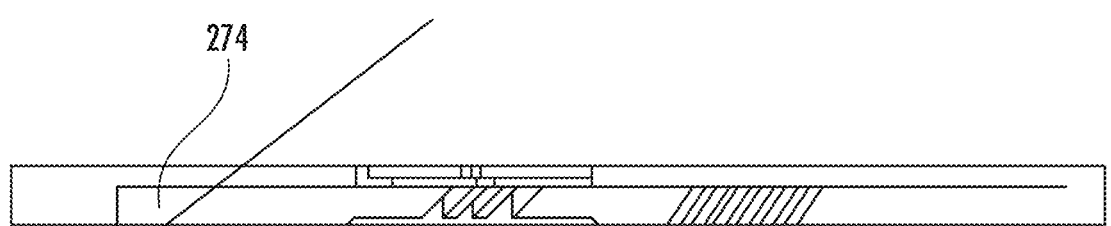
FIG. 25 depicts an example edge reflector with a linear profile.

FIG. 25 depicts a linear profile of a standard edge reflector 274 used in a millisecond anneal system. According to example embodiments of the present disclosure, the temperature uniformity of a wafer can be modified by converting the profile shape from linear to parabolic, or a combination hereof, and/or by the relative position to the wafer. This determines the size and location of the heated zone on the wafer edge.

Figure 26A:
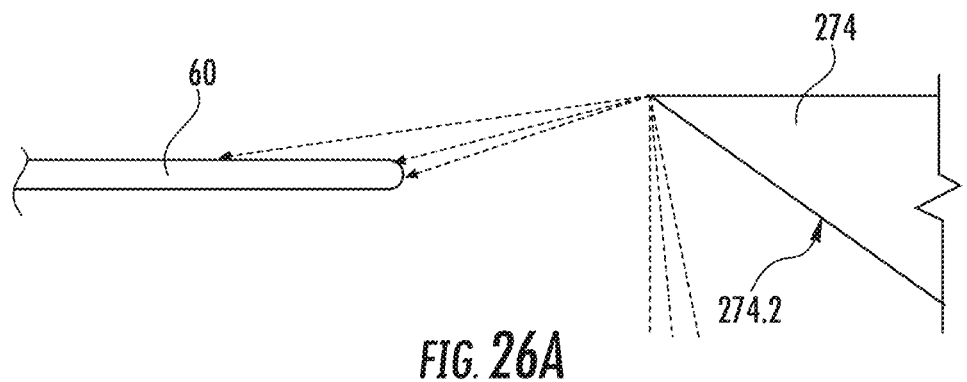
FIGS. 26(a), 26(b) and 26(c) depicts various heated zones on a wafer by edge reflectors of varying shapes and positions according to example embodiments of the present disclosure.
Figure 26B:
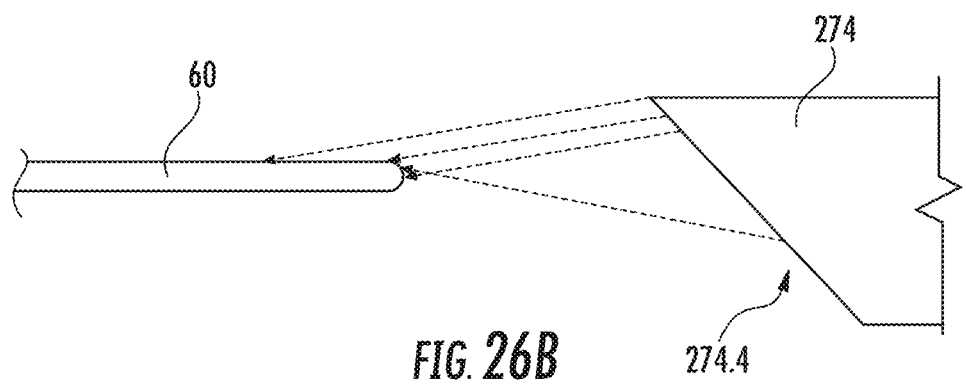
Figure 26C:
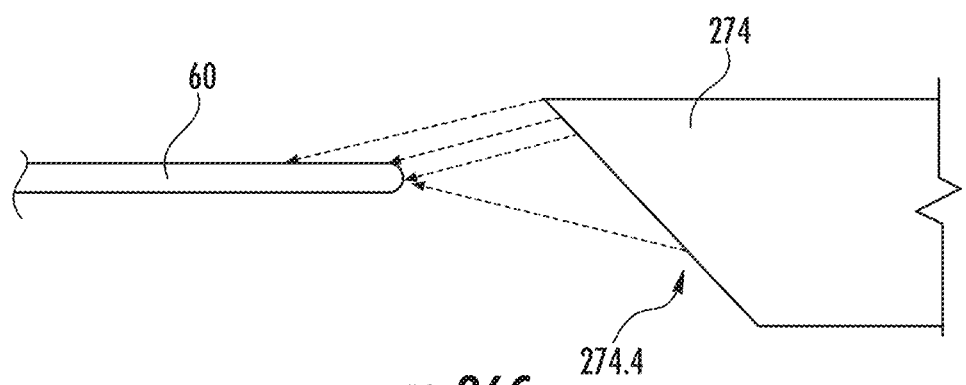

More particularly, FIG. 26(*a*) depicts the reflection of light onto a substrate 60 by an edge reflector 274 with a linear profile 274.2. FIG. 26(*b*) depicts the reflection of light onto a substrate 60 by an edge reflector 274 with a combination of a parabolic and linear profile 274.4. FIG. 26(*c*) depicts the reflection of light onto substrate 60 by an edge reflector 274 with a combination of a parabolic and linear profile 274.4 but with an adjusted position relative to the substrate.

In some embodiments, the edge reflectors 274 can be mounted to a motor or other mechanical apparatus that can be configured to adjust the position and/or surface profile of the edge reflectors. For instance, a controller can adjust the position of one or more edge reflectors in real time in response to temperature measurements of the substrate to provide for more uniform processing.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A process for thermally treating a substrate in a thermal processing system, comprising:
    obtaining data indicative of a temperature profile associated with one or more substrates during processing in a thermal processing system, the thermal processing system having a wafer plane plate dividing the processing chamber into a top chamber and a bottom chamber; and
    adjusting a pressure in the processing chamber to affect a temperature uniformity across one or more substrates based at least in part on the data indicative of the temperature profile;
    wherein adjusting a pressure in the process chamber comprises warping a water window based on the pressure in the processing chamber.

2. The process of claim 1, wherein adjusting a pressure comprises adjusting the pressure in the processing chamber during processing of at least one of the one or more substrates to adjust a temperature profile of the at least one of the one or more substrates.

3. The process of claim 1, wherein the pressure is adjusted within the range of about +2 kPa to about −2 kPA relative to atmospheric pressure.

4. The process of claim 1, wherein adjusting the pressure in the processing chamber comprises adjusting a pressure differential between the processing chamber and a downstream line in a gas flow system configured to flow process gas through the processing chamber, the downstream line located downstream of one or more vent openings in the process chamber.

5. The process of claim 4, wherein adjusting the pressure differential comprises adjusting a valve disposed in the downstream line.

6. The process of claim 5, wherein the valve is adjusted, by one or more controllers, based on one or more signals from a pressure sensor configured to measure pressure inside the processing chamber.

7. The process of claim 1, wherein the pressure is adjusted to influence a flow pattern of process gas in the processing chamber.

8. The process of claim 1, wherein the water window comprises an inner plate and an outer plate with water flowing between the inner plate and the outer plate, the inner plate being disposed closer to the processing chamber relative to the outer plate.

9. The process of claim 8, wherein the water window is warped such that the inner plate of the water window bends away from the processing chamber to provide a defocusing effect on lamp light.

10. The process of claim 8, wherein the water window is warped such that the outer plate of the water window bends toward the processing chamber to provide a focusing effect on lamp light.

* * * * *